United States Patent [19]

Tengler et al.

[11] 4,052,117
[45] Oct. 4, 1977

[54] INTEGRATED CIRCUIT SOCKET

[75] Inventors: John N. Tengler, Chardon; Stephen A. Mesaros, Mentor; John T. Venaleck, Painesville, all of Ohio

[73] Assignee: A P Products Incorporated, Painesville, Ohio

[21] Appl. No.: 623,672

[22] Filed: Oct. 20, 1975

[51] Int. Cl.² ...................... H01R 11/22; H01R 23/02
[52] U.S. Cl. .............. 339/17 CF; 339/95 D; 339/176 M
[58] Field of Search .......... 339/17 CF, 95 D, 176 M, 339/176 MP

[56] References Cited
U.S. PATENT DOCUMENTS

| 3,135,822 | 6/1964 | Baran | 339/95 D |
| 3,138,421 | 6/1964 | Locher | 339/95 D |
| 3,601,775 | 8/1971 | Longenecker | 339/176 MP |
| 3,815,077 | 6/1974 | Anhalt | 339/95 D |
| 3,854,788 | 12/1974 | Goodman | 339/17 CF |

Primary Examiner—Roy Lake
Assistant Examiner—Mark S. Bicks
Attorney, Agent, or Firm—Donnelly, Maky, Renner & Otto

[57] ABSTRACT

A socket for dual in line package integrated circuits has a high retention force for a correspondingly low insertion force. Each of a plurality of contacts in a dielectric housing bends relatively easily as a lead of such package is inserted and as such insertion is completed the contact assumes a residual position for good electrical and mechanical connection to the lead. Friction between the lead and contact effects movement of the latter to change the geometry thereof as the former is withdrawn, whereby the contact binding force against lead increases to increase the force required for completion of such withdrawal.

6 Claims, 7 Drawing Figures

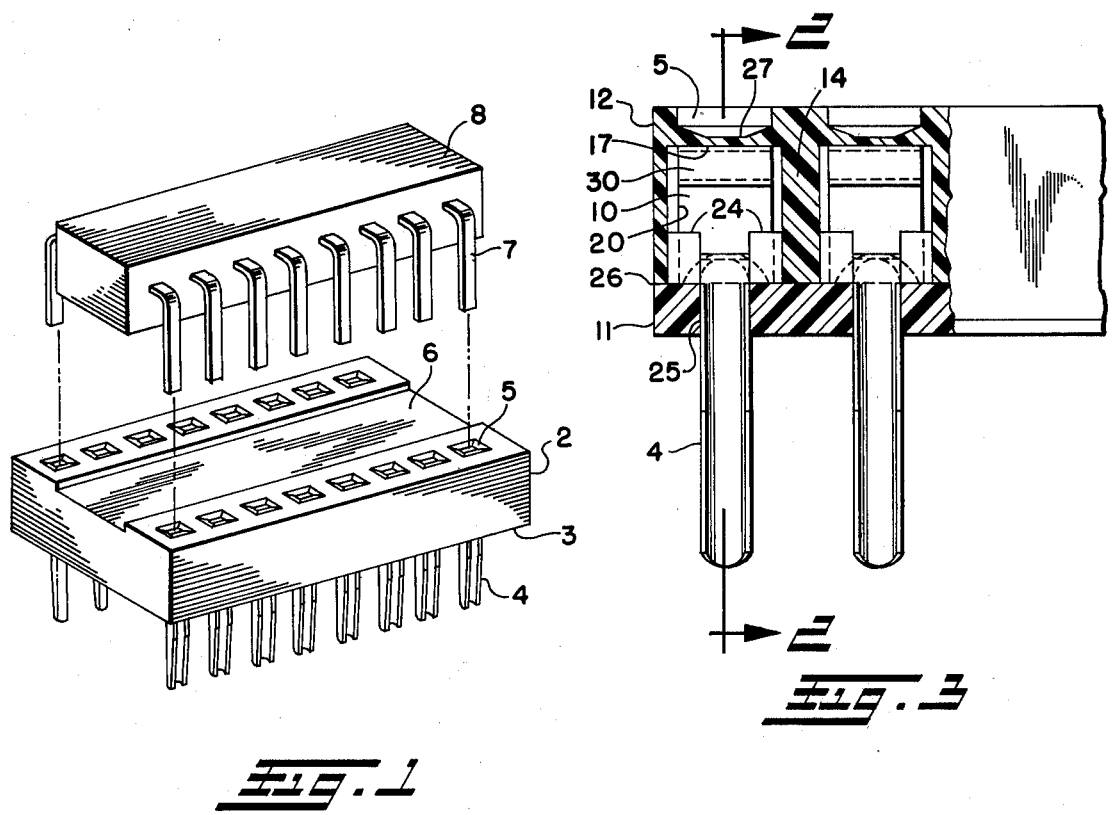
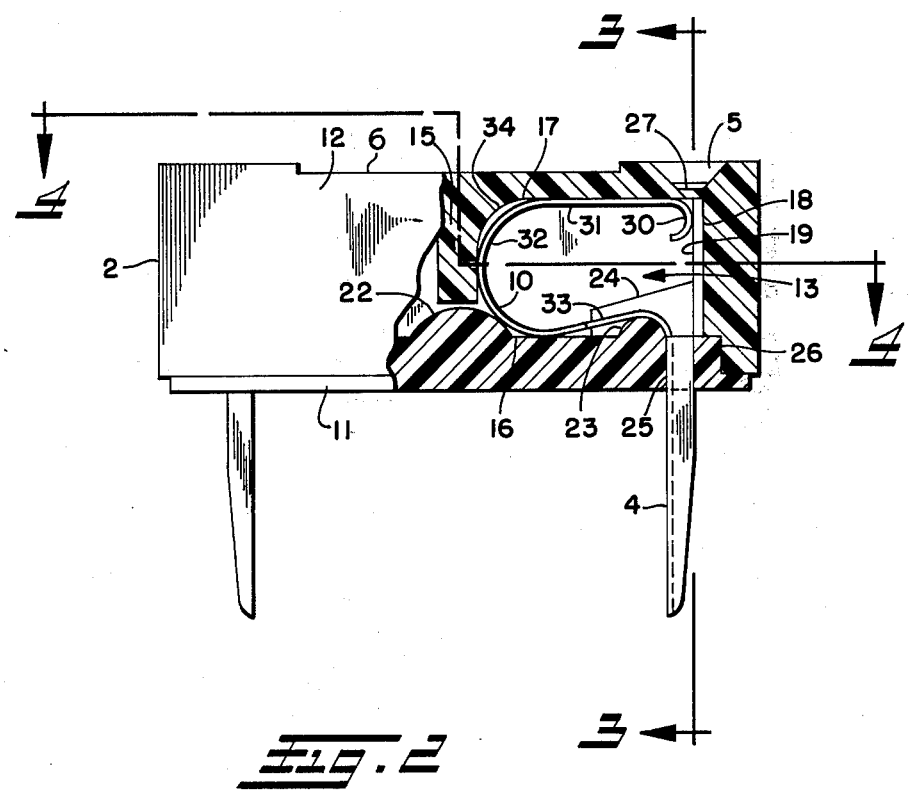

INTEGRATED CIRCUIT SOCKET

BACKGROUND OF THE INVENTION

This invention relates to a socket for dual in line package integrated circuits, and more particularly relates to such a socket which requires larger forces for withdrawal of such package than for insertion thereof.

Typical electrical connectors use fork contacts supported in a housing, and each contact has opposed fork portions usually bent toward each other for wiping opposite sides or edges of an electrical lead during insertion thereof so as to form an electrical connection therebetween. During ingress of the lead into engagement with a single or double fork contact, large axial friction and mechanical forces are required to urge the lead past the forward-most portions of such contacts due to their geometry in order to achieve sufficient lateral motion of the forks for full insertion of the leads into the connector. Such axial forces are subsantially higher on ingress than on egress because in the former the contact geometry must be changed to permit the lead to pass, whereas in the latter there is no geometry change but rather merely a spring-like friction force exerted by the contact on the lead.

Since the leads of conventional integrated circuit packages are usually quite frail, it is desirable to avoid direct soldering or other type of attachment thereof to external circuits; thus, integrated circuit sockets are used which have contact leads for direct engagement to such external circuits and contact connecting portions for respectively connecting leads of such package. Integrated circuit sockets are used primarily to effect connections between the leads of an integrated circuit package and external circuitry, for example, on a printed circuit board by soldering the contacts of the socket to the board. One area of concern with electrical connectors and particularly with integrated circuit sockets for dual in line packages is that the socket must exert adequate holding power on the package leads to preclude inadvertent separation and that the force required for insertion of the package leads into the socket be sufficiently small to avoid damage to the frail leads. To effect these functions many prior art integrated circuit sockets require a third member which is actuated to lock the socket contact into retaining engagement with respective inserted leads, for example, by changing the geometry of such contact. In order to achieve desired holding power or retention characteristics in prior art sockets without such third member, the contacts must require a high insertion force on the order of one pound per lead, which are frail and subject to buckle or other damage when inserted with such force.

SUMMARY OF THE INVENTION

In the instant invention a socket for integrated circuit packages provides good retention characteristics with minimum insertion force requirements, and in the preferred embodiment the force required to withdrawal the package leads from the socket is approximately twice the force required for insertion into engagement with the socket contacts. The socket includes a housing in which are positioned a plurality of electrical contacts arranged in opposed parallel rows, and the contacts are formed and positioned to facilitate automatic changes in the geometry thereof as a function primarily of the friction between respective leads and contacts to increase the forces required for withdrawal as the lead is partially withdrawn. The contacts have tail portions referred to as contact leads extending externally of the socket housing for soldered engagement to circuits on a printed circuit board, coupling to wire wrap posts, or connections to other external circuits; however, the socket also may be formed as an integral part of a circuit assembly provided with more direct attachment to the contact. Moreover, although the preferred embodiment of the invention takes the form of a socket for integrated circuits, the principles of the invention may be used for other types of electrical connector devices, for example, which provide for connection to connector pins for a male plug-type connector or terminal pads at the end of circuits on a printed circuit boards; also, the principles of the invention may be used with other types of mechanical devices wherein one member is inserted for retention by another with a requirement that the force for withdrawal of the latter from the former equals or exceeds that required for insertion.

Accordingly, a primary object of the invention is to provide an electrical connector improved in the noted respects.

Another object of the invention is to provide high withdrawal forces with concurrent low insertion forces in an intergrated circuit socket, other type electrical connector, or the like.

An additional object of the invention is to facilitate connection and removal of integrated circuit dual in line packages to printed circuit boards, wire wrap panels, or the like.

A further object of the invention is to provide for connection and removal of integrated dual in line packages without injuring the leads thereof.

Still another object of the invention is to provide a force balance between opposed parallel rows of leads inserted into engagement with contacts in an integrated circuit socket.

Still an additional object of the invention is to effect firm retention of an intergrated circuit package in an intergrated circuit socket wherein the withdrawal force from the latter equals or exceeds the insertion force thereof.

Still a further object of the invention is to provide an integrated circuit socket having contacts constituted only in two dimensions, the width dimension being selectively variable for correspondingly variable spacing density or the like.

Yet another object of the invention is to increase the resistance to withdrawal of one member from another during such withdrawal.

Yet an additional object of the invention is to change the geometry of an electrical contact in a connector by the friction forces developed upon the removal of a member engaged therewith so as to increase the holding power of the former to the latter.

These and other objects and advantages of the present invention will becone apparent as the following description proceeds.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 1 is an exploded isometric view of a socket in accordance with the invention positioned to receive the lead of an integrated circuit dual in line package;

FIG. 2 is an end elevation view of the socket of FIG. 1 partially broken away in a typical section view to show the electrical contacts thereof;

FIG. 3 is a section view of the socket looking in the direction of arrows 3—3 of FIG. 2;

DESCRIPTION OF THE PREFERRED EMBODIMENT

Figure 4:
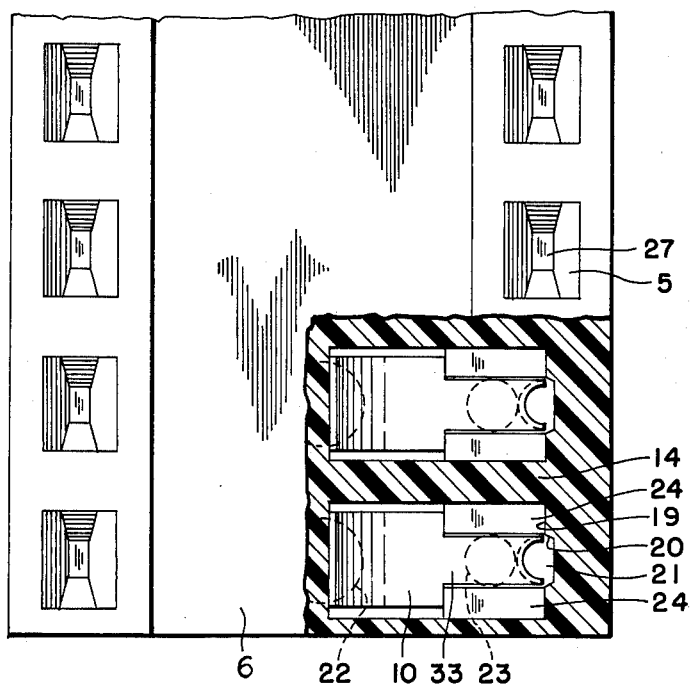
FIG. 4 is a top plan view of the socket with a portion broken away as a typical section view looking in the direction of the arrows 4—4 of FIG. 2.

Referring now to the drawings, wherein like reference numerals refer to like elements in the several figures, a socket in accordance with the invention is generally illustrated at 1 in FIG. 1. The socket includes an electrically non-conductive substantially enclosed housing 2 from the bottom 3 of which extend a plurality of contact leads 4, which are adapted for soldered attachment to circuits on a conventional printed circuit board, not shown. A plurality of beveled openings 5 in the housing top 6 are arranged in two parallel rows at spaced apart positions to receive the leads 7 from an integrated circuit dual in line package 8 for connection to respective contacts in the housing, the number of such leads and contacts in the housing 2 being variable depending on the size and circuit capacity of the integrated circuit package.

In normal use of the socket 1 the contact leads 4, which are approximately of a tapered semi-cylindrical configuration, are inserted into openings in a conventional printed circuit board and soldered thereto, whereby the contacts within the housing 2 become extensions of respective circuits on such printed circuit board. Alternatively, the contact leads 4 may be configured as as socket for engagement with conventional wire wrapping posts. The leads 8 of the integrated circuit package 8 will then be aligned with the openings 5 and an insertion force applied to the package body to effect insertion of the leads into the openings for engagement with respective electrical contacts interiorly of the connector housing 2. The integrated circuit package 8 thereafter may be withdrawn from the socket 1 by applying a withdrawal force to withdraw the leads 7 from the housing 2. In the preferred embodiment of the invention using the geometrical configuration of the contacts, the insertion force is approximately ½ pound per lead and the withdrawal force is approximately one pound per lead.

Turning now more particularly to FIGS. 2, 3 and 4, the fundamental elements of the socket 1 include a plurality of electrical contacts 10 positionally retained within the housing 2, which comprises a base 11 and a lid 12. The housing interior is divided into a number of compartments 13 in which respective contacts 10 are positioned, such compartments being formed by side divider walls 14 and back support divider wall 15 which constitute ribs molded inside the lid 12. The respective contacts 10 are thus maintained electrically insulated one from another and in alignment for engagement with integrated circuit package leads inserted into the respective beveled openings 5.

Within each of the compartments 13 are functional back support divider, bottom, top, and front walls 15 through 18, the latter also including vertically extending land portions 19 having edges 20 between which is established a channel 21. On the bottom wall 16 are a stress limiting bump surface 22, a forming bump surface 23 and a pair of ramps 24, all preferably molded as part of the housing base 11 for purposes to be described below. A relatively tight fitting opening 25 in the base 11 provides an exit for the contact lead 4, and in the preferred embodiment, the former may be self-punctured by the latter. Moreover, the housing base 11 and lid 12 are preferably ultra-sonically welded at 26 to seal the same, and respective frangible membranes 27 formed in each of the openings 5 provides a temporary seal completing the closure for the respective compartments 13 to prevent contamination of the electrical contacts 10a therein. A more detailed description of such membrane is found in U.S. patent application Ser. No. 623,670 filed concurrently herewith now abandoned for "Protective Membrane For Connectors", which is assigned to the same assignee as the instant patent application.

Each electrical contact 10 includes a rolled or curved nose connecting portion 30 movably supported by the lateral arm 31 of support portion 32, having a reduced cross-section 33, which fits between the ramps 24 and is bent over the forming bump 23 to join the contact lead 4. The forming bump 23 prevents sharp bending of the contact during manufacture to assure a smooth transition from the contact lead 4 to the resilient support portion. The contact 10 is supported in the compartment 13 by the friction forces between the contact lead 4 and housing base 11 at the tight fitting opening 25 and is further laterally supported at the reduced cross-section portion 33, which fits closely between the two walls of the ramps 24.

A back part of the support portion 32 is normally in abutment with the back support divider wall 15 under the influence of a slight pre-stress bias force exerted on the nose 30 by the land portions 19, which are preferably approximately one-half to two-thirds the thickness of the leads 7, and this arrangement assures that the latter will strike the contact nose 30 upon insertion and easily deform the same. In FIG. 2 the electrical contact is in its rest position with the lateral arm 31 urged into engagement with the top wall 17 by the resilience of the support portion 32, and the nose 30 in engagement with land portions 19. As described in more detail below, the stress limiting bump 22 and curved area 34 of the back support divider wall 15 assure that the curved contact support portion 32 will not buckle or otherwise permanently bend during insertion and/or withdrawal of a lead 7.

All of the electrical contacts 10 in respective compartments 13 in the socket housing 2 are identical and operate substantially simultaneously as respective integrated circuit package leads 7 are inserted into respective openings 5 for engagement with the contacts. The co-action between one such lead 7 and one electrical contact 10 is described principally with reference to FIGS. 5A, 5B and 5C, wherein the contact is shown, respectively, in its maximum deformed, residual, and binding position. Moreover, as will also become apparent as the description proceeds, the lateral distance between contacts and the width of each individual contact may be varied depending on the density or spacing parameters of the leads with which the socket 1 is used since the functional dimensions of the contacts are only the length, thickness and geometry thereof.

Since normal use of the socket 1 would have the contact leads 4 wave soldered to a printed circuit board, without the membrane 27 intact deposits of the lubricating flux may occur on the nose connecting portions 30 of the contacts 10 interiorly of the housing 2 reducing the holding power of the contacts. Moreover, the intact membrane prohibits other contaminant deposition on the contacts 10 which would impede the electrical conductivity thereof. Therefore, preferably the socket 1 would be soldered to a printed circuit board while the membranes are whole, and insertion of the lead 7 of the integrated circuit package 8 into respective openings 5 in the socket would fracture the respective membranes 27 permitting engagement of the leads with the corresponding contacts 10; in the preferred embodiment, the force required to fracture the membrane is preferably approximately equal to the force required to deflect the contact permitting complete insertion of the respective leads in a single continuous action.

Figure 5A:
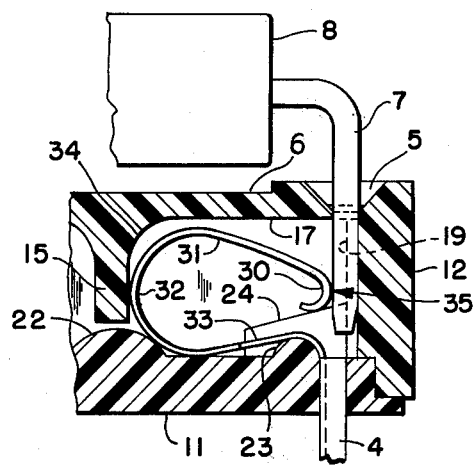
FIGS. 5A, 5B and 5C are typical section views of the socket and contact illustrating the principles of operation thereof.
Figure 5B:
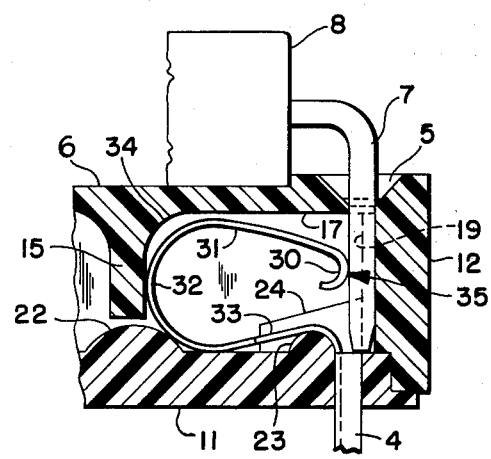
Figure 5C:
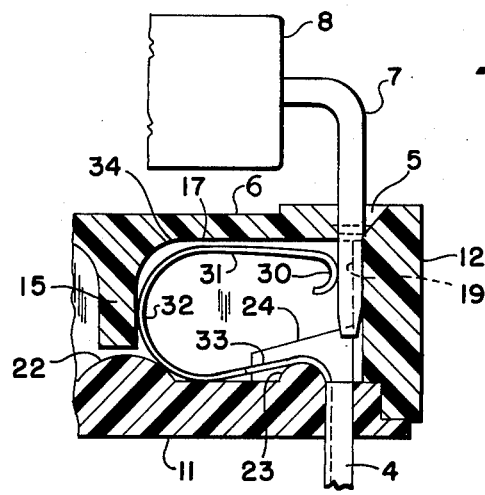

As a lead 7 is first inserted into an opening 5, the membrane 27 is fractured and the lead continues to travel downwardly guided in the channel 21 into abutment with a portion of the curved nose connecting portion 30 of the contact 10, which is initially in its rest condition as illustrated in FIG. 2. Further insertion force to the lead 7 operates over the relatively long lateral arm 31, as a moment arm, easily to deflect the contact resilient support portion 32 while the nose 30 rolls away from the land 19 until a bottom part of the nose 30 strikes the surfaces of the ramps 24, as illustrated in FIG. 5A. During insertion of the lead 7 up to the point that the contact nose strikes the ramps, there is only a minimum of relative movement between the lead and nose, whereby primarily the only force required to be overcome by the lead insertion force depends on the effective spring constant of the resilient support portion 32 and the length of the lateral arm 31.

By the time the contact nose connecting portion 30 strikes the ramps 24, the effective angle between the nose and lead 7 is relatively small which facilitates further insertion of the lead downwardly in the channel 21. Moreover, as the insertion force to the lead 7 is continued, the nose is urged by the latter to slide down the ramps and the static friction force between the lead and nose is overcome, whereby the lead continues to its ultimate insertion in abutment with the base 11 and the spring force of the contact resilient support portion 32 overcomes the dynamic or sliding friction between the lead and nose so that the contact snaps upward to its residual position shown in FIG. 5B.

It is important that the angle of the ramps 24 relative to the horizontal plane of the base 11 be sufficiently large to allow the mentioned sliding movement of the contact nose 30 to facilitate the lead 7 passing by with minimum resistance to insertion. Too slight an angle may resist the nose sliding on the ramps causing a friction locking of lead 7 and precluding further insertion thereof. As shown and described, however, the lead and contact remain in their fully inserted and residual static position in good electrical engagement as shown at 35 in FIG. 5B.

When the lead is withdrawn there is an initial friction binding force between the contact nose connecting portion 30 and the lead 7 itself due to the contact design whereby it is preloaded in its at rest position, and the ultimate withdrawal force required to withdraw the lead from engagement with the contact and out of the socket housing opening 5 is dependent on such force, which is variable and increases as the lead is partially withdrawn. Thus, as the lead 7 is withdrawn from its fully inserted position illustrated in FIG. 5B, the initial static friction force between the lead and the contact nose 30 force the latter and the lateral arm 31 upward to the contact binding position shown in FIG. 5C.

The withdrawal force required to overcome the binding force is related to the mechanical advantage of the contact through which the binding force is exerted, and such mechanical advantage is a function of the contact geometry especially with respect to the lead. More specifically, the mechanical advantage depends on the angle that the binding force is applied to the lead, whereby a force perpendicular to the lead effects the greatest static friction binding action thereof, and such angle is a function of position on the nose connecting portion 30 that the lead 7 engages the contact 10 and the angle of the lateral arm 31 from the horizontal rest position of FIG. 2. Therefore, as the lead is withdrawn further upward from the binding position illustrated in FIG. 5C, the static friction force between the contact nose 30 and the lead 7 causes the lateral arm 31 of the resilient support portion 32 to move closer to the top chamber wall 17, which further increases the mechanical advantage of the contact and the binding force exerted by the contact on the lead. When the withdrawal force exceeds the maximum binding force, which is a function of the static coefficient of friction between the connecting portion 31 and lead 7, completion of withdrawal is effected.

It should now be understood that the insertion force for the leads 7 into the socket 1 is primarily only a function of the spring force of the contact 10 and the length of the lateral arm 31, whereas the force required to withdraw the leads is a variable function of the increasing mechanical advantage of the lateral arm 31, which is also related to the geometry of the contact and the compartment 13, and the coefficient of static friction between the point of engagement of the contact and the lead. The divider support wall 15 confines the contacts 10 trapping the same and allowing the lateral arm 31 to reach a position to exert the maximum binding force, and the curved area 34 of such wall and the stress limiting bump 22 limit the maximum stress on the proximate parts of the contacts to avoid buckling or other permanent deformation thereof during lead withdrawal. Moreover, by increasing the radius of curvature of the contact nose connecting portion 30, the point of such engagement is made more remote from the lateral arm 31, which effects a decrease in the required withdrawal force, whereas a decrease in such radius of curvature will increase the withdrawal force or, in other words, the effective holding power of the contact. Another way to vary contact holding power is to vary the lead and contact plating; for example, tin plating effects stronger lead retention than gold plating. Also, by using tin plated leads and contacts a higher withdrawal force occurs than by using gold plated leads and contacts.

The embodiments of the invention in which an exclusive property or privilege is claimed are defined as follows:

1. An electrical connector, comprising:

an electrically non-conductive housing having an interior compartment, and opening means in the former for access to the latter;

electrical contact means in said compartment for engaging a member inserted through said opening means;

said electrical contact means including a curved connecting portion in said compartment for movement by and wiping engagement with such member upon insertion thereof and for binding engagement with the latter to resist withdrawal thereof, and means for movably supporting said connecting portion relative to said opening means for such engagement with such inserted member, sai means for movably supporting comprising a curved resilient support portion coupled by a relatively straight lateral arm portion to said connecting portion, said means for movably supporting being resiliently deformable by force applied thereto via said connecting portion by insertion of such member, and wherein movement of said connecting portion by such inserted member effects a bending in said curved resilient support portion with travel of said connecting portion in a direction substantially parallel to the insertion direction of such member, and said means for movable supporting being cooperable with said connecting portion for urging the latter to engagement with such inserted member so that upon partial removal of such inserted member friction forces between the latter and said connecting portion urge said lateral arm to a position of increased mechanical advantage relative to such inserted member thus increasing the effective binding force exerted on such inserted member and resistance to withdrawal thereof; and ramp surfaces in said housing for limiting the extent of such bending and travel.

2. An integrated circuit socket, comprising an electrically non-conductive housing and a plurality of electrically conductive contacts positioned in said housing for electrical and mechanical engagement with leads of an integrated circuit package inserted into said housing; said housing comprising openings means for access to said contacts by respective inserted leads; each of said contacts comprising a movable connecting portion coupled by a lateral arm portion to a resilient support portion, a portion of the latter being secured in said housing and the former being positioned proximate an respective one of said openings; sloped surface means in said housing for limiting movement of said connecting portion; and means in said housing for confining said electrical contact, said means for confining comprising means for limiting stress on said electrical contact by support of the same to prevent permanent deformation damage thereto; whereby insertion of a lead in an opening to engagement with the connecting portion of said contact causes said contact to bend until the connecting portion strikes said sloped surface, further insertion of such lead breaks the static friction between the same and said connecting portion permitting the latter to assume a residual position in firm engagement with such lead, and withdrawal of such lead urges said contact into binding engagement with the same to resist such withdrawal.

3. An integrated circuit socket as set forth in claim 2, said resilient support portion being curved and adapted to be deformed in opposition to its natural force as said connecting portion is moved by such lead, and said connecting portion being curved to facilitate sliding thereof on said sloped surface and movement relative to such lead.

4. An electrical connector, comprising:

an electrically non-conductive housing having an interior compartment, and opening means in the former for access to the latter; and electrical contact means in said compartment for engagement with a member inserted through said opening means;

said electrical contact means including a curved connecting portion movably positioned in said compartment for movement by and wiping engagement with such member upon insertion thereof and for binding engagement with the latter to resist withdrawal thereof, means for movably supporting said connecting portion proximate said opening means for cooperation with such inserted member to increase such binding and resistance to withdrawal as such member is partially withdrawn from said compartment, a curved resilient support portion coupled by a lateral arm portion to said connecting portion, whereby upon partial removal of said inserted member friction forces between the latter and said connecting portion urge said lateral arm to a position of increased mechanical advantage relative to said inserted member thus increasing the effective binding force and resistance to withdrawal thereof;

means in said housing for pre-stressing said electrical contact means, said means for pre-stressing comprising channel-forming wall means proximate said connecting portion for bearing against the same and means for confining said electrical contact means within said interior compartment for urging said connecting portion against said channel-forming wall means; and wherein movement of said connecting portion by such inserted member effects a bending in said curved resilient support portion with travel of said connecting portion in a direction substantially parallel to the insertion direction of such member, and further comprising ramp surfaces in said housing for limiting the extent of such bending and travel.

5. An electrical connector as set forth in claim 4, further comprising means in said compartment for limiting stress on said electrical contact means.

6. An electrical connector as set forth in claim 5, said electrical contact means having a contact lead means for external connection extending through said housing in a tight fitting hole for support thereby.

* * * * *